United States Patent
Black et al.

[11] Patent Number: 6,157,271
[45] Date of Patent: Dec. 5, 2000

[54] RAPID TUNING, LOW DISTORTION DIGITAL DIRECT MODULATION PHASE LOCKED LOOP AND METHOD THEREFOR

[75] Inventors: Gregory Redmond Black, Vernon Hills; Louis Michael Nigra, Chicago; Michael Edward Denzin, Crystal Lake, all of Ill.

[73] Assignee: Motorola, Inc., Schaumburg, Ill.

[21] Appl. No.: 09/197,986

[22] Filed: Nov. 23, 1998

[51] Int. Cl.[7] .............................. H03C 3/00; H03L 7/093; H03L 7/10; H03L 7/16; H04L 27/12
[52] U.S. Cl. .............................. 332/127; 331/16; 331/17; 331/23; 332/100; 375/303; 375/305; 375/376; 455/260
[58] Field of Search .................................. 331/1 A, 4, 8, 331/10, 14, 16, 17, 25, DIG. 2, 23; 327/156–159; 375/376, 272–278, 303–307; 455/260; 332/100, 127, 128

[56] References Cited

U.S. PATENT DOCUMENTS 3,831,195   8/1974   Davis et al. .............................. 360/51
5,424,688   6/1995   Phillips ..................................... 331/16

*Primary Examiner*—David Mis
*Attorney, Agent, or Firm*—Randall S. Vaas; Daniel K. Nichols

[57] ABSTRACT

A direct modulation phase lock loop (PLL) a voltage controlled oscillator (VCO) (114). A divider (118) has a first divider input coupled to the VCO and a second divider input to receive a modulation inducing divisor sequence. A phase detector (102) has a first detector input coupled to the divider to receive the output thereof, and a second detector input to receive a reference input. A tuning circuit (306, 406) is coupled to the phase detector and the VCO, the tuning circuit responsive to a variable DC reference potential such that the tuning circuit has a frequency response that is constant over the modulation bandwidth whereby the PLL is a type 1 PLL with low modulation distortion.

16 Claims, 2 Drawing Sheets

RAPID TUNING, LOW DISTORTION DIGITAL DIRECT MODULATION PHASE LOCKED LOOP AND METHOD THEREFOR

FIELD OF THE INVENTION

The present invention relates to phase-lock loops (PLLs), and more particularly to phase lock loops having low distortion and rapid tuning with direct digital modulation.

BACKGROUND OF THE INVENTION

PLLs are commonly used in radio systems to stabilize the output phase of a voltage controlled oscillator (VCO). PLLs generally comprise a VCO enveloped by a control loop comprising; a frequency divider for dividing the frequency of the VCO by a divisor; a phase detector and stable frequency reference for generating a voltage or current analogue of the phase difference between the divided VCO signal and the stable reference; and a loop filter for producing a VCO control voltage from the phase detector output. A direct digital modulating PLL induces a modulation of the VCO output phase by varying the divisor of the frequency divider.

In the Global System for Mobile communication (GSM) standard, the transmit VCO must be able to lock a 100 MHz step to better than 90 Hz accuracy in under 200 microseconds. This is due to the need to minimize current drain by turning the transmit subsystem OFF when not in use and restart quickly upon turn ON. It is furthermore important that this specification be met over a significant range of temperature and part variations.

Direct digital modulation is highly desirable, but very difficult to accommodate, in such an environment. Avoiding distortion of the modulation is perhaps the most difficult challenge. In GSM systems, the measure of modulation distortion is the global phase error standard, which imposes a modulation phase distortion limit of 5 degrees rms.

To achieve low distortion of the modulation phase, the PLL loop filter must be carefully designed for phase linearity as well as for the usual design criteria of stability, lock time and PLL bandwidth.

Modulated signals have a spectrum characterized by a modulation bandwidth. The modulation bandwidth is the frequency range, offset from the channel center, in which the spectral power of the modulation resides. In GSM systems the modulation bandwidth is approximately 100 KHz. Direct digital modulation requires a PLL band width to be greater than the modulation bandwidth in order to avoid attenuation of the modulation content at the higher offset frequencies.

Further challenging the successful completion of a direct digital modulating PLL is the need to suppress unwanted spurious emissions. In GSM systems, the output radio frequency (RF) spectrum due to the modulator must be suppressed by 30 dBC at 200 KHz offset from the carrier, and by 60 dBC at 400 KHz offset from the carrier. The GSM specification further requires that spurious emissions at a frequency offset greater than 1.8 MHz from the channel center have a power level below 30 dBm. These restrictions on spurious emissions impose upper limits on the PLL bandwidth.

When a phase-locked loop (PLL) must tune rapidly over a wide frequency range, produce low modulation distortion that dictates wide PLL bandwidth, and produce low spurious emissions that dictate high selectivity, conventional loop filter configurations can be inadequate. A conventional type II PLL can provide rapid tuning over a wide range, but good selectivity generally leads to a compromise in modulation fidelity.

It is therefor desirable to provide an improved PLL.

DETAILED DESCRIPTION OF THE DRAWINGS

An improved direct modulation phase lock loop (PLL) includes a VCO. A divider has a first divider input coupled to the VCO and a second divider input to receive a modulation inducing divisor sequence. A phase detector has a first detector input coupled to the divider to receive the output thereof, and a second detector input to receive a reference input. A tuning circuit is coupled to the phase detector and the VCO, the tuning circuit responsive to a variable DC reference potential such that the tuning circuit has a frequency response that is constant over the modulation bandwidth whereby the PLL is a type 1 PLL with low modulation distortion during a tracking mode, and wherein the tuning circuit has a switchable low-pass filter response to operate as a type II PLL during an acquisition mode.

The improved PLLs permit a very low modulation distortion and low spurious spectral emissions. In particularly advantageous embodiments, the improved PLLs can be used in any application requiring a wide tuning range and rapid acquisition such as a direct modulation synthesizer requiring rapid tuning and a wide tuning range.

An advantageous GSM transmitter is based on a multiple accumulator PLL synthesizer which generates the required Gaussian Minimum Shift Keying (GMSK) modulation for GSM-based cellular phones. In such a transmitter, the modulation process varies the divisor of the divider, the variable divisor sequence being generated in a multiple accumulator sequence generator. The PLL must have a well damped response with a bandwidth on the order of the modulation bandwidth, which can for example be 100 KHz in an implementation such as a cellular radiotelephone, to pass the desired modulation with minimum distortion. The PLL must also, in the exemplary cellular radiotelephone application, have approximately 20 dB of rejection at an offset of 400 KHz to suppress the noise in the transmitter band and meet the −60 dBC attenuation requirement of the GSM specification for output RF spectrum due to modulation.

Figure 1:
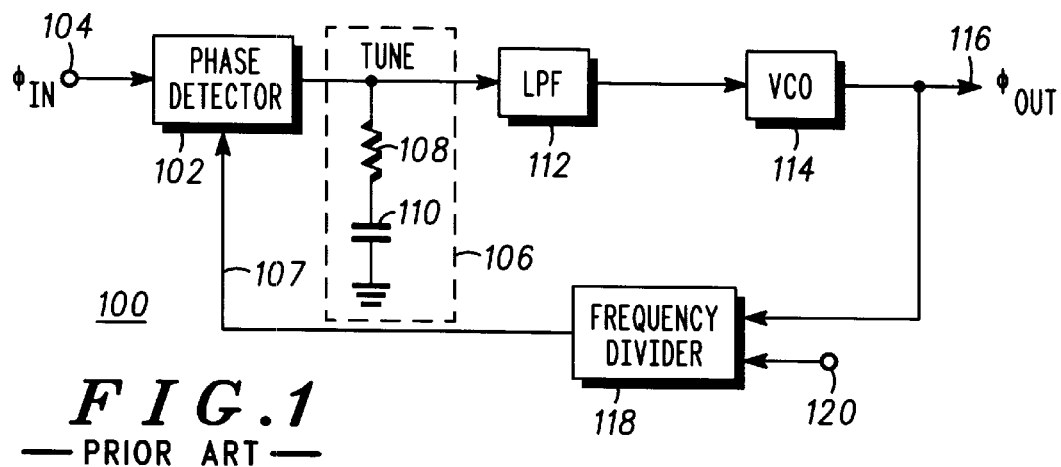
FIG. 1 is a circuit schematic partially in block diagram form illustrating a prior art type II PLL.

A type II PLL 100 (FIG. 1) according to the prior art, which could be used in a GSM transmitter, includes phase detector 102 receiving a reference phase at input 104 and a feedback signal at input 107. The phase detector produces an output signal which is a current analogue of the phase difference of the reference input 104 and the feedback input 107. The output of the phase detector 102 is connected to a tuning circuit 106.

The tuning circuit 106 includes a resistor 108 and a capacitor 110. Those skilled in the art will recognize that a type II PLL has two integrators in the loop. Capacitor 110, when driven by the phase detector output current source via resistor 108, is one integrator in the loop. The tuning circuit 106 is illustrated connected to a filter 112. The filter actually includes the tuning circuit 106, and circuitry to affect any additional filtering that may be desired. The output of the low-pass filter is connected to a VCO 114, which outputs a signal having a frequency proportional to the control input thereto. VCO 114 affects a second integrator in the loop.

The output 116 of the VCO is the phase locked signal. The phase locked signal is input to a divider 118. The divider steps the signal frequency down and inputs this signal to a phase detector, which compares the reference phase signal to the feedback signal from divider 118. A variable divisor sequence is input at input 120, responsive to which the divider 118 generates a modulated signal.

The type II PLL 100 has a second order open transfer function at low frequency, which is characterized by the amplitude roll-off and phase response. For example, the PLL can be provided with a roll-off rate of 12 dB per frequency octave, and by a phase response of −180 degrees. As the frequency increases toward the unity gain frequency, which is approximately equal to the loop bandwidth, there is a transmission zero in the open-loop frequency response. The frequency of the transmission zero affects the stability margin, damping factor and selectivity of the closed loop response of PLL 100, and may limit the applications in which the PLL 100 may be employed. For example, when the PLL is used in a transmitter, this transmission zero produces significant phase distortion of the transmitter modulation when the loop filter is designed for good selectivity and rapid tuning. The distortion can be eliminated by increasing the transmission zero frequency beyond the modulation bandwidth, but to do this and maintain stability, it is necessary to increase the unity gain bandwidth of the transmission zero frequency. In practical transmitter applications, however, this results in insufficient rejection of the wideband transmitter noise.

The distortion could also be reduced, while providing the required loop bandwidth, by reducing the transmission zero frequency to near DC. However, this requires an impractical large value for capacitor 110. The value of the capacitor 110 is limited mainly by the requirement of rapid tuning, but also by secondary factors such as physical size and dielectric absorption. In general, a larger capacitance results in slower acquisition time for the PLL, a larger capacitor in physical size, and greater dielectric absorption. In transmitters for systems such as the GSM system, the requirement for rapid acquisition precludes the use of a large capacitor.

The tuning speed is approximately the time it takes to charge capacitor 110 to the required tuning voltage from its initial voltage given the current provided by the phase detector in acquisition mode:

$$T_{tune}=(\Delta V * C)/I_{cp}$$

where:

$T_{tune}$=the required time to reach the desired frequency;

$\Delta V$=the change in voltage required;

C=the capacitor value; and $I_{cp}$=the phase detector current available during acquisition.

An advantage of the type II PLL is that the capacitor provides a method of achieving an arbitrarily large tuning range since, given an appropriate time, the capacitor can be charged to an arbitrary voltage with an arbitrary phase detector current.

Figure 2:
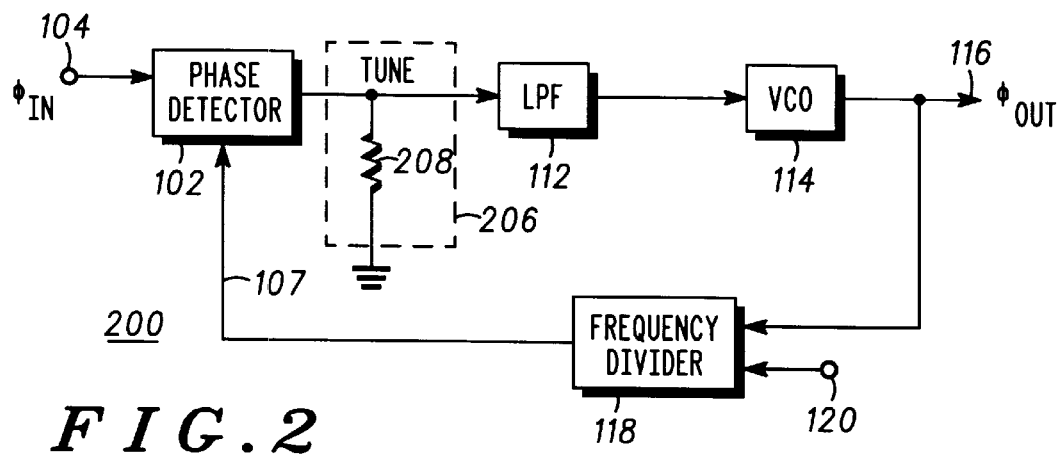
FIG. 2 is a circuit schematic in block diagram form illustrating an improved PLL.

A type I PLL 200 (FIG. 2) includes a tuning circuit 206. The tuning circuit 206 consists of a resistor 208. The PLL 100 lacks the integrator in the tuning circuit, and has only a single integrator in the loop. The single integrator is affected by the VCO 114. Because it does not have a capacitor in the tuning circuit, the frequency response of the tuning circuit is constant from DC to a frequency beyond the PLL bandwidth.

PLL 200 does not include a transmission zero, as it does not have a capacitor, and therefore does not produce the distortion created by the type II PLL 200. The PLL 200, having only a single integrator is inherently stable and it is possible to lower the PLL bandwidth arbitrarily without causing the instability that occurs in higher order loops. Therefore a PLL 200 may be designed with bandwidth that is the same or slightly higher than the modulation bandwidth, but low enough to achieve sufficient wideband noise attenuation without causing loop instability. This, for some applications comprises the total solution to the problem of modulation distortion and wideband noise in a modulating PLL.

However, with a type I PLL, since there is no capacitor, the tuning range is limited to:

$$\Delta f = F_n * \phi_{max} * N$$

where:

$\Delta f$=one-sided deviation from center frequency at VCO output;

$f_n$=natural frequency of the PLL where open-loop gain magnitude is used;

$\phi_{max.}$=one-sided maximum range of the phase detector; and

N=feedback divider ration, $f_{in}/f_{out}$.

This tuning range limit may prevent its use with the PLL bandwidth, reference frequency and tuning range required for some applications, such as direct GSM modulation.

Figure 3:
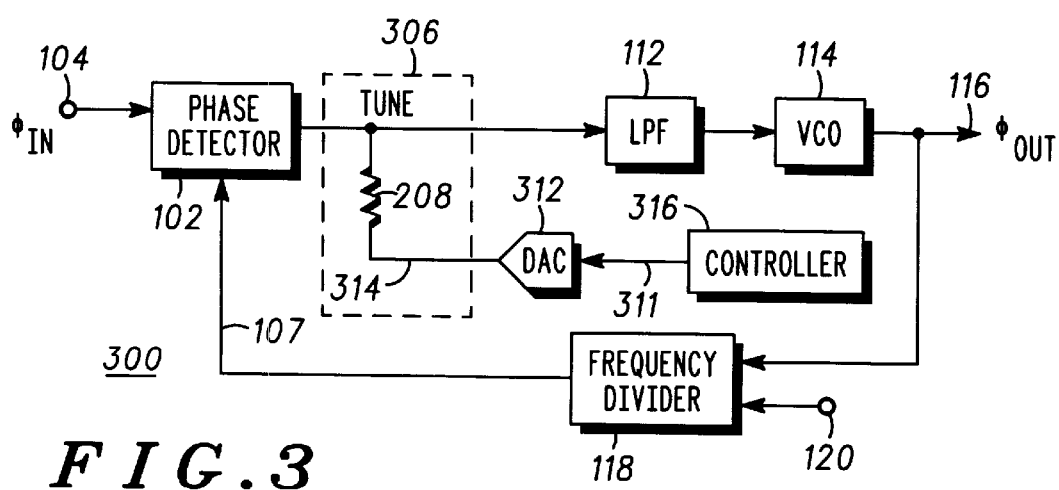
FIG. 3 is a circuit schematic in block diagram form illustrating an alternate embodiment of an improved PLL.

An improved PLL 300 is illustrated in FIG. 3. PLL 300 includes a variable reference tuning circuit 306. The tuning circuit 306 includes a digital to analog converter (DAC) 312 connected to an input 311. A controller 316 generates a digital open loop frequency control signal. The output of DAC 312 is connected to terminal 314, having DC tuning voltage potential thereon. The DAC 312, under the control of the digital open loop frequency control signal at input 311, produces a variable DC reference potential at terminal 314. The tuning voltage at terminal 314 is the tuning voltage for the expected frequency to which the PLL will lock.

The controller 316, which can be a programmable logic unit, a microprocessor, or the like, includes a memory storing values which are predetermined for each of the frequency ranges at which the PLL is expected to operate. These signals are provided to the DAC when the PLL is operating for a particular expected frequency range. By providing a non-grounded reference potential at terminal 314 associated with the frequency of the PLL, the acquisition time of the PLL is reduced.

PLL 300 avoids the frequency range limitation of PLL 100 by employing a variable DC tuning circuit 306 connected to the reference potential at terminal 314 of the tuning circuit 306. Since the DAC 312 is a direct current (DC) voltage source, its alternating current (AC) potential remains at ground potential, and all of the aspects of PLL dynamics such as bandwidth and noise rejection are the same as in the PLL 200 having ground referenced tuning. This type of PLL solves the problems of modulation distortion and wideband noise in a PLL and has improved tuning range capability compared to the PLL of FIG. 2. However there remains undesirable aspects of PLL 300 operation due to the required knowledge of the tuning voltage, at terminal 314, within +/−ΔV, in order for the PLL to acquire lock. There is a need for aging stability and temperature stability of the VCO, and for calibration and storage of the open loop frequency control signal at input 311 in controller 316. PLL 300 is most useful for those applications requiring a VCO tuning voltage of 0 volts +/−ΔV, and this greatly limits the frequency range of this PLL.

Figure 4:
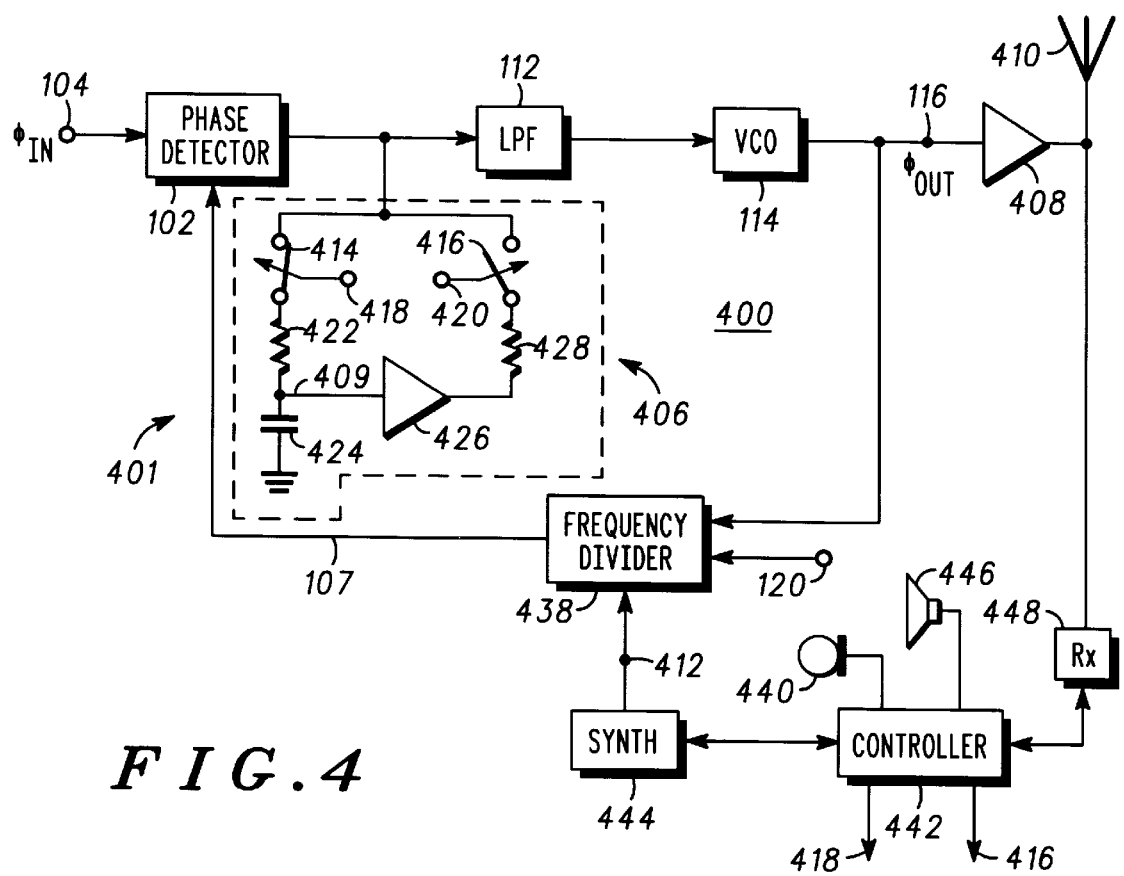
FIG. 4 is a circuit schematic in block diagram form illustrating another alternate embodiment of an improved PLL.

A wireless communication device 401 including an improved PLL 400 for direct digital modulation is shown in FIG. 4. As was the case for PLL 300, the improved PLL 400 is a type 1 PLL with a DC reference potential at terminal 409. However, the tuning circuit 406 generates the DC reference potential 409 automatically by tuning the PLL with a type II loop prior to operation in a type 1 mode. This eliminates the need for knowledge of the tuning voltage within +/−ΔV, relaxes the temperature and aging stability requirements of the VCO, and eliminates the need for calibration and storage of the open loop frequency control signal provided at input 311 required for PLL 300 of FIG. 3.

The wireless communication device 401 (FIG. 4) can be a cellular telephone, a two-way radio, a modem or any other communication device. The communication device 401 includes direct modulation at divider 438, which receives data to be transmitted at input 412. The modulated data is output at output 116. The modulated data is amplified in amplifier 408 for transmission via antenna 410.

In communication device signals detected by microphone 440 are converted to digital signals in controller 442 and synthesizer 444 prior to being input to frequency divider 438. Signals received via antenna 410 are demodulated in receiver 448 and input to controller 442 . These signals can include control signals processed in controller 442 in a conventional manner and voice signals output through speaker 446.

The tuning circuit 406 is a switched tuning circuit as it includes switches 414 and 416. These switches 414 and 416 are connected to receive control signals at inputs 418 and 420, respectively. The control signals are generated by controller 442, and indicate whether the communication device is locking onto a signal or has already acquired phase lock. The switches can be implemented using transistors, such as field effect transistors or bipolar transistor arrangements. Switch 414 is connected to ground via a resistor 422 and capacitor 424. The junction 409 of resistor 422 and capacitor 424 is connected to switch 416 via a buffer amplifier 426 and a resistor 428.

The phase detector is illustrated as a current source phase detector, but can be implemented as a voltage source phase detector. The low pass filter 112, is an optional element and will only provided if filtering in addition to that provided by the tuning circuits 106, 206, 306, and 406 are required for the PLL. The VCO is a conventional VCO. The frequency divider 438 is a variable divider operating on the VCO output 116, and responsive to the divisor at input 120. The divisor is preferably generated using a multiple accumulator generator. Operations of the multiple accumulator sequence generator is such that the sequence at input 120 produces the desired modulation on the VCO output 116. Other types of sequence generators could be employed. The modulated data could alternatively be input at the phase detector reference input 104, or the data could be input through a combination of input 120 and input 104.

In operation, during frequency acquisition, the circuit is in a type 11 state, with switch 414 in the ON (closed) position and S2 the OFF (open) position. Resistor 428 and the output of amplifier 426 are isolated from the rest of the circuit. Amplifier 426 has a very high input impedance, therefore it does not significantly impact the circuit when switch 416 is open. This configures the loop as a type-II PLL. During acquisition, the type 11 modulation distortion is irrelevant and its arbitrary tuning range is necessary to achieve rapid lock. The phase detector provides current to capacitor 424 until it approaches the required tuning voltage. The loop then begins the lock-in process. In this configuration, resistor 422 is selected to meet stability margin and lock-in behavior requirements of the PLL. Capacitor 424 is selected to achieve the acquisition time required, and thus it has a low capacitance to permit rapid acquisition.

Once the frequency is acquired, which is identified in any suitable conventional manner, the loop is reconfigured in a type I state by turning switch 414 OFF (open) and turning switch 416 ON (closed). When switch 414 is OFF, resistor 422 is removed from the circuit, and capacitor 424 is isolated, having been charged to the required tuning voltage. Capacitor 424 will maintain this voltage for a time subject to leakage effects. This voltage is also maintained at the output of amplifier 426, a unity gain voltage amplifier, or buffer. The amplifier 426 and capacitor 424 act as a low impedance voltage source at the capacitor voltage. With switch 416 ON, the nominal tuning voltage is applied as an offset to resistor 428 instead of being grounded.

In the embodiment of FIG. 4, the terminal at the output of the phase detector 102 is connected to a reference which is the nominal tuning voltage. Accordingly, the phase detector 102 is not required to provide any direct current (DC) input to maintain frequency. Instead, it is only required to compensate for DC offsets and capacitor drift. It will also inject a small alternating current (AC) to track dynamic phase shifts, such as the desired modulation of data. Since the output impedance of amplifier 426 is low, the amplifier acts as a connection to ground for AC signals, making it dynamically equivalent to a type I loop. This dynamic equivalence means that the modulation distortion will be low as in the conventional, ground referenced type I loop.

While in the type I configuration, although isolated by amplifier 426, capacitor 424 will discharge slowly due to effects such as self leakage, finite resistance of circuit connections such as switch 414, and bias current required by the input of amplifier 426. A change in voltage at capacitor 424 will produce a corresponding change at the output of amplifier 426. The PLL 400 will adjust the phase of the VCO, and therefore the output current of the phase detector 102, to maintain a constant tuning voltage. Since the voltage across the resistor 422 is the difference between this constant tuning voltage and the output of amplifier 426, changes in this amplifier's output force corresponding changes in phase. The relationship between capacitor voltage changes and VCO output phase can be expressed as:

$$\delta\phi(t) = -N^* (1/K_\phi)^* (\delta V_c(t)/R_1)$$

where:

$\delta\phi(t)$=Change in VCO output phase in radia;

$\delta v_c(t)$=Change in capacitor Cl voltage; and $K_\phi$=Phase detector gain in Amps per Radia.

The discharge is typically linear since it is caused by a constant leakage current from the capacitor. The voltage drift is therefore:

$$\delta v_c(t) = -(I_{leak}/C)^* t$$

where:

$I_{leak}$=Leakage current leaving the capacitor.

Substituting this into the above equation:

$$\delta\phi(t) = N^*(1/K_\phi)^*(I_{leak}/R1^*C)^*t.$$

The derivative of this phase drift is a constant frequency shift:

$$\delta\omega = N^*(I/K_\phi)^*(I_{leak}/R1^*C)$$

Leakage therefore must be controlled to meet frequency error requirements

Noise at the output of amplifier 426 translates directly to phase noise by the same equation governing capacitor drift above:

$$\phi_n(t) = -N^*(I/K_\phi)^*(v_N(t)/R1)$$

An operational amplifier used must have carefully specified noise performance over critical frequency ranges in order to meet output spectral purity requirements.

The high fidelity modulation aspects of PLL 400 are potentially applicable to any frequency synthesis subsystem that uses direct modulation techniques, including all analog and digital wireless subsystems. The rapid-tuning aspects will have additional applicability to any subsystem that uses direct modulation techniques and requires rapid tuning such as Time Division Multiple Access (TDMA) and Frequency Hopping Spread Spectrum.

A track and hold circuit is provided by capacitor 424, amplifier 426, and switches 414 and 416. The track and hold circuit provides a smooth transition from a type II PLL filter to a type I PLL filter. The type II PLL filter is used during frequency acquisition for its tuning range capability. The type I filter is used during tracking mode to maintain good modulation fidelity. In a GSM TDMA system, wherein the data bursts are relatively short, and the transceiver acquires the frequency at the beginning of every burst to permit power down between bursts, the capacitor is small (such as 0.01 $\mu$F for example) to facilitate rapid acquisition and meet the holding period of approximately 1 millisecond.

An advantageous GSM transmitter can thus be made that incorporates a multiple accumulator PLL synthesizer which generates the required Gaussian Minimum Shift Keying (GMSK) modulation for GSM-based cellular phones. The PLL has a well-damped response with a bandwidth on the order of the modulation bandwidth to pass the desired modulation with minimum distortion. The PLL also provides the desired rejection at an offset of 400 KHz to suppress the noise in the transmitter band and meet the −60 dBC attenuation requirement of the GSM specification for output RF spectrum due to modulation.

Thus it can be seen that an improved PLL is provided. The PLL uses a small capacitor to acquire a signal channel quickly. The potential on the capacitor is held following acquisition to provide a desirable global noise performance.

What is claimed is:

1. A direct modulation phase lock loop (PLL) having a modulation bandwidth and comprising:
    a voltage controlled oscillator (VCO);
    a divider having a first divider input coupled to the VCO, and a second divider input to receive a modulation inducing divisor sequence;
    a phase detector having a first detector input coupled to the divider to receive an output thereof, and a second detector input to receive a reference input; and
    a tuning circuit coupled to the phase detector and the VCO, the tuning circuit responsive to a variable DC reference potential such that the tuning circuit has a frequency response that is constant over the modulation bandwidth wherein the PLL operates as a type 1 PLL during a tracking mode, and wherein the tuning circuit has a switchable low-pass filter response to cause the PLL to operate as a type II PLL during an acquisition mode.

2. The direct modulation PLL as defined in claim 1, and further including a low pass filter coupled to the tuning circuit and having an output connected to an input of the VCO.

3. The direct modulation PLL as defined in claim 1, wherein the tuning circuit is coupled to a DC reference potential generating circuit that generates a variable DC potential associated with a tuning frequency of the PLL.

4. The direct modulation PLL as defined in claim 1, wherein the variable DC reference potential is generated by sampling an output of the phase detector during acquisition by the PLL and holding a sampled value after acquisition.

5. The direct modulation PLL as defined in claim 4, wherein the tuning circuit includes a first switch element connected to ground through a resistor and a capacitor and a second switch element connected to a junction of the resistor and capacitor through an amplifier.

6. The direct modulation PLL as defined in claim 1, embodied within a wireless communication device.

7. The direct modulation PLL as defined in claim 6, wherein the wireless communication device comprises a cellular telephone.

8. The direct modulation PLL as defined in claim 6, wherein the wireless communication device comprises a two-way radio.

9. The direct modulation PLL as defined in claim 6, wherein the wireless communication device comprises a modem.

10. A method of providing a PLL for a direct digital modulation including a phase detector, a tuning circuit and a voltage controlled oscillator and a frequency divider, the direct digital modulation occurring at the frequency divider, the method comprising:
    operating the PLL as a type II PLL during frequency acquisition; and
    operating the PLL as a type I PLL during tracking mode to maintain good modulation fidelity, including holding a voltage on a capacitor during tracking.

11. A PLL comprising:
    a phase detector;
    a switched tuning circuit having a control input for receipt of a control signal;
    a low pass filter coupled to the switched tuning circuit;
    a voltage controlled oscillator coupled to the low-pass filter; and
    a frequency divider coupled between the voltage controlled oscillator and the phase detector;
    wherein the switched tuning circuit includes a series connection of a resistor and capacitor in a frequency acquisition mode, and a hold circuit during a tracking mode.

12. The PLL as defined in claim 11, wherein the switched tuning circuit includes a first resistor, a second resistor, a capacitor, and an amplifier, the amplifier connected between a junction of the first resistor and the capacitor and having an output connected to the second resistor, the first and second resistors selectively connected to the phase detector via respective switches.

13. The PLL as defined in claim 11, embodied within a wireless communication device.

14. The PLL as defined in claim 13, wherein the wireless communication device comprises a cellular telephone.

15. A method of providing a PLL for a direct digital modulation including a phase detector, a tuning circuit and a voltage controlled oscillator and a frequency divider, the direct digital modulation occurring at the frequency divider, the method comprising:
    within a wireless communication device;
    operating the PLL as a type II PLL during frequency acquisition; and
    operating the PLL as a type I PLL during tracking mode to maintain good modulation fidelity.

16. The method as defined in claim 15, wherein the wireless communication device is selected from a cellular telephone, a two-way radio and a modem.

* * * * *